(12) United States Patent
Conn et al.

(10) Patent No.: US 10,577,907 B2
(45) Date of Patent: Mar. 3, 2020

(54) MULTI-LEVEL MODELING OF STEAM ASSISTED GRAVITY DRAINAGE WELLS

(71) Applicant: International Business Machines Corporation, Armonk, NY (US)

(72) Inventors: Andrew R. Conn, Mount Vernon, NY (US); Lior Horesh, North Salem, NY (US); Matthias Kormaksson, Rio de Janeiro (BR); Moshood Omolade Saliu, Calgary (CA); Theodore G. van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 502 days.

(21) Appl. No.: 15/275,951

(22) Filed: Sep. 26, 2016

(65) Prior Publication Data

US 2018/0087356 A1    Mar. 29, 2018

(51) Int. Cl.
*E21B 43/24*    (2006.01)
*G05B 17/02*    (2006.01)
*G06F 17/50*    (2006.01)

(52) U.S. Cl.
CPC .......... *E21B 43/2406* (2013.01); *G05B 17/02* (2013.01); *G06F 17/50* (2013.01)

(58) Field of Classification Search
CPC .... E21B 43/00; E21B 43/2406; E21B 47/042; E21B 49/00
See application file for complete search history.

(56) References Cited

U.S. PATENT DOCUMENTS

| | | |
|---|---|---|
| 6,257,334 B1 | 7/2001 | Cyr et al. |
| 7,879,768 B2 | 2/2011 | Wu |
| 8,146,669 B2 | 4/2012 | Mason |
| 8,756,019 B2 | 6/2014 | Pimenov et al. |
| 8,849,639 B2 | 9/2014 | Brown et al. |
| 8,977,502 B2 | 3/2015 | Liu |
| 9,043,189 B2 | 5/2015 | Wallace et al. |
| 9,085,958 B2 | 7/2015 | Laing et al. |

(Continued)

FOREIGN PATENT DOCUMENTS

CN    203905930    10/2014

OTHER PUBLICATIONS

Wikipedia, "Linear Regression", down loaded Mar. 2019.*

(Continued)

*Primary Examiner* — Kandasamy Thangavelu
(74) *Attorney, Agent, or Firm* — Joseph Petrokaitis; Otterstedt, Wallace & Kammer, LLP

(57) ABSTRACT

One aspect includes a method for use with a steam assisted gravity drainage well. The method includes generating an analytical framework for the well at least in part by modeling one or more observable variables as a function at least of one or more control variables; and modeling one or more output variables as a function at least of at least one of the one or more control variables; and at least one of the one or more observable variables. The method further includes utilizing the analytical framework to determine an optimal configuration for the well, the optimal configuration including a set of one or more values for the one or more control variables which produce one or more desired values for the one or more output variables; and configuring the well to operate with the determined optimal configuration.

18 Claims, 9 Drawing Sheets

(56) References Cited

U.S. PATENT DOCUMENTS

| | | | |
|---|---|---|---|
| 9,163,497 B2* | 10/2015 | Laing | E21B 47/042 |
| 9,587,480 B2 | 3/2017 | Guerrero et al. | |
| 9,739,125 B2 | 8/2017 | Benson et al. | |
| 9,803,469 B2 | 10/2017 | Kaiser et al. | |
| 9,845,669 B2 | 12/2017 | Miller et al. | |
| 9,964,654 B2 | 5/2018 | Laake | |
| 10,088,596 B2 | 10/2018 | Maerten | |
| 2006/0095872 A1 | 5/2006 | McElvain et al. | |
| 2007/0055392 A1 | 3/2007 | D'Amato et al. | |
| 2009/0166033 A1* | 7/2009 | Brouwer | E21B 43/00 166/250.02 |
| 2011/0060572 A1* | 3/2011 | Brown | E21B 43/00 703/10 |
| 2011/0288778 A1 | 11/2011 | Pavlovich et al. | |
| 2011/0320047 A1 | 12/2011 | Stone et al. | |
| 2012/0024524 A1 | 2/2012 | Marsimovich et al. | |
| 2012/0059640 A1 | 3/2012 | Roy et al. | |
| 2013/0105147 A1 | 5/2013 | Scott | |
| 2013/0175030 A1 | 7/2013 | Ige et al. | |
| 2013/0262061 A1 | 10/2013 | Laake | |
| 2013/0277049 A1 | 10/2013 | Liu | |
| 2014/0124194 A1 | 5/2014 | Jorshati | |
| 2014/0216732 A1 | 8/2014 | Stone et al. | |
| 2014/0216739 A1 | 8/2014 | Brown et al. | |
| 2014/0352966 A1 | 12/2014 | Yuan | |
| 2015/0009499 A1 | 1/2015 | Lin et al. | |
| 2015/0114633 A1 | 4/2015 | Godfrey et al. | |
| 2015/0161304 A1 | 6/2015 | Vachon | |
| 2015/0198022 A1 | 7/2015 | Stanecki et al. | |
| 2015/0354336 A1* | 12/2015 | Maurice | E21B 43/2406 706/12 |
| 2016/0032692 A1 | 2/2016 | Conn et al. | |
| 2016/0054713 A1 | 2/2016 | Foss et al. | |
| 2016/0098502 A1 | 4/2016 | Havre et al. | |
| 2016/0201453 A1 | 7/2016 | Kaiser et al. | |
| 2016/0245065 A1 | 8/2016 | Gray et al. | |
| 2016/0245071 A1 | 8/2016 | Vincelette et al. | |
| 2016/0251957 A1 | 9/2016 | Mcewen-king et al. | |
| 2016/0281497 A1* | 9/2016 | Tilke | E21B 49/00 |
| 2016/0312592 A1 | 10/2016 | Chen et al. | |
| 2016/0312599 A1 | 10/2016 | Adam et al. | |
| 2017/0045055 A1 | 2/2017 | Hoefel et al. | |
| 2017/0051597 A1 | 2/2017 | Akiya et al. | |
| 2017/0177992 A1 | 6/2017 | Klie | |
| 2017/0336811 A1 | 11/2017 | Stone et al. | |
| 2017/0350217 A1* | 12/2017 | Paul | E21B 43/2406 |
| 2017/0351227 A1* | 12/2017 | Paul | E21B 43/00 |
| 2018/0087371 A1 | 3/2018 | Vincelette et al. | |
| 2018/0195374 A1 | 7/2018 | Stalder | |

OTHER PUBLICATIONS

Di Serio et al., "Investigating Determinants of Multiple Sclerosis in Longitunal Studies: A Bayesian Approach", Journal of Probability and Statistics, 2009.*

Hastie et al., "Generalized additive modles for medical research", Statistical methods in medical research, 1995.*

Marxa et al., "Direct generalized additive modeling with penalized likelihood", Computational Statistics & Data Analysis, 1998.*

Ullah et al., "Applications of functional data analysis: A systematic review", BMC Medical Research Methodology, 2013.*

Andrew R. Conn, Cross-Well Allocation Optimization in Steam Assisted Gravity Drainage Wells, unpublished U.S. Appl. No. 15/276,020, filed Sep. 26, 2016, pp. 1-22 plus 8 sheets drawings.

Andrew R. Conn, Controlling Operation of a Steam-Assisted Gravity Drainage Oil Well System Utilizing Continuous and Discrete Control Parameters, unpublished U.S. Appl. No. 15/276,152, filed Sep. 26, 2016, pp. 1-44 plus 10 sheets drawings.

Andrew R. Conn, Controlling Operation of a Steam-Assisted Gravity Drainage Oil Well System By Adjusting Controls to Reduce Model Uncertainty, unpublished U.S. Appl. No. 15/276,168, filed Sep. 26, 2016, pp. 1-35 plus 6 sheets drawings.

Andrew R. Conn, Controlling Operation of a Steam-Assisted Gravity Drainage Oil Well System By Adjusting Multiple Time Step Controls, unpublished U.S. Appl. No. 15/276,178, filed Sep. 26, 2016, pp. 1-36 plus 8 sheets drawings.

Andrew R. Conn, Controlling Operation of a Steam-Assisted Gravity Drainage Oil Well System By Adjusting Controls Based on Forecast Emulsion Production, unpublished U.S. Appl. No. 15/276,189, filed Sep. 26, 2016, pp. 1-37 plus 12 sheets drawings.

List of IBM Patents or Patent Applications Treated As Related.

N. Alau et al., "Neural Network Meta-Modeling of Steam Assisted Gravity Drainage Oil Recovery Processes," Iranian Journal of Chemistry & Chemical Engineering, vol. 29, No. 3, Sep. 2010, pp. 109-122.

C. Blundell et al., "Weight Uncertainty in Neural Networks," 2015, 10 pages.

N.V. Queipo et al., "Surrogate Modeling-Based Optimization of SAGO Processes," Journal of Petroleum Science and Engineering, Jul. 2002, pp. 83-93, vol. 35, Nos. 1-2.

IP.com, "Methods for SAGO Optimization," IP.com No. IPCOM000213572D, Dec. 21, 2011, 10 pages.

H.X. Nguyen et al., "Experimental Design to Optimize Operating Conditions for SAGO Process," Society of Petroleum Engineers (SPE), SPE Asia Pacific Oil & Gas Conference and Exhibition, SPE 145917, Sep. 2011, 11 pages, Jakarta, Indonesia.

Dennis Denney, "Real-Time Optimization of SAGO Operations," Society of Petroleum Engineers, Journal of Petroleum Technology (JPT), Jun. 2013, pp. 126-128, vol. 65, No. 6.

Shin et al., "Review of Reservoir Parameters to Produce SAGO and Fast-SAGO Operating Conditions," Journal of Canadian Petroleum Technology (JCPT), Jan. 2007, pp. 35-41, vol. 46, No. 1.

English translation for China Application No. CN203905930U.

* cited by examiner

100

300

400

500

600

700

900

MULTI-LEVEL MODELING OF STEAM ASSISTED GRAVITY DRAINAGE WELLS

CROSS REFERENCE TO RELATED APPLICATIONS

The present application is related to concurrently-filed and commonly-owned U.S. patent application Ser. No. 15/276,020, which has identical inventorship to the present application, the entire disclosure of which is expressly incorporated by reference herein for all purposes.

BACKGROUND

The present invention relates to the electrical, electronic and computer arts, and, more particularly, to modeling of steam assisted gravity drainage wells.

Steam assist gravity drainage (SAGD) refers to a method of extracting bitumen from oil sands. A SAGD well includes two parallel horizontal pipes, one above (e.g., less deep than) the other. Steam is injected into the upper pipe, called the injection pipe, to heat the surrounding earth. Heating reduces the viscosity of the bitumen contained in the oil sands allowing it to flow under gravity. This flow of bitumen and water condensate is collected and extracted by pumping using the lower pipe, called the producer pipe.

Costs in a SAGD operation are dominated by the cost of heating the steam relative to the amount of bitumen extracted. Thus, there is a long-felt but unmet need to model the behavior of the SAGD well with the aim of optimizing the production of bitumen with the least amount of steam. The inventors are unaware of any systematic data-driven predictive modeling for these kinds of data.

SUMMARY

According to an embodiment of the present invention, one aspect includes a method for use with a steam assisted gravity drainage well. The method comprises generating an analytical framework for the well at least in part by modeling one or more observable variables as a function at least of one or more control variables; and modeling one or more output variables as a function at least of at least one of the one or more control variables; and at least one of the one or more observable variables. The method further comprises utilizing the analytical framework to determine an optimal configuration for the well, the optimal configuration comprising a set of one or more values for the one or more control variables which produce one or more desired values for the one or more output variables; and configuring the well to operate with the determined optimal configuration.

An embodiment of the present invention includes a method for use with a steam assisted gravity drainage well. The method comprises generating an analytical framework for the well at least in part by modeling one or more observable variables as a function of at least one or more control variables; and modeling one or more output variables as a function of at least one of the one or more control variables; and at least one of the one or more observable variables. The method further comprises utilizing the analytical framework to determine an optimal configuration for the well, the optimal configuration comprising a set of one or more values for the one or more control variables which produce one or more desired values for the one or more output variables; and configuring the well to operate with the determined optimal configuration.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

These and other features and advantages of the present invention will become apparent from the following detailed description of illustrative embodiments thereof, which is to be read in connection with the accompanying drawings.

DETAILED DESCRIPTION

Figure 1:
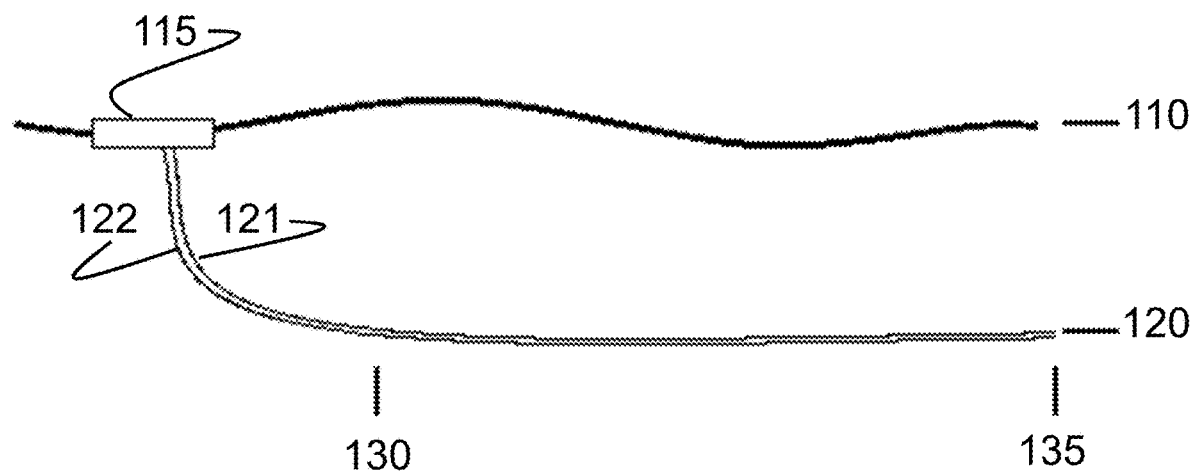
FIG. 1 shows an exemplary steam assist gravity drainage (SAGD) well suitable for use with an illustrative embodiment of the present invention.

FIG. 1 shows an exemplary steam assist gravity drainage (SAGD) well 100 suitable for use with an illustrative embodiment of the present invention. The SAGD well 100 includes a pair of well pipes (injector pipe 121, for steam injection, and producer pipe 122, for emulsion return) located at a level 120 within an oil sands layer below surface 110. Level 120 is typically about 150-1200 meters, and more specifically about 300-900 meters, below surface 110, though it may be shallower or deeper.

Pipes 121 and 122 are substantially horizontal, and substantially parallel to each other, at least in the region between heel 130 and toe 135. The region between heel 130 and toe 135 is referred to as the steam injection zone or steam chamber, and the portions of the pipes within this zone are referred to as the "lead in," which may be about 500-1000 meters in length, or which may be shorter or longer. Pipes 121 and 122 are connected to well pad 115 at surface 110, and the total length of each pipe between well pad 115 and heel 130 may be about 500-1000 meters, or may be shorter or longer.

Pipes 121 and 122 may be separated by a distance of about 2-5 meters, although this separation may be higher or lower. At least within the steam injection zone, injector pipe 121 is located above producer pipe 122. Pipes 121 and 122 are slotted and valved to facilitate optimal extraction. There are temperature sensors along the respective well bores for both pipes 121 and 122.

Steam is injected into the well through the injector pipe 121 at heel 130 and toe 135 to heat the surrounding earth in the steam injection zone proximate to the well. Heating reduces the viscosity of the bitumen contained in the oil sands allowing it to flow under gravity. As the well heats, a steam pocket is formed and the bitumen contained in the porous rock loses much of its viscosity and is able to flow under gravity along with steam condensate and ground water as emulsion. This flow of emulsion, including bitumen and water condensate, is collected using producer pipe 122. Thus, circulation of the steam injected by pipe 121 makes oil move towards well producer pipe 122. Emulsion is extracted and returned by pumping from the producer pipe 122 to bring it to the well pad 115 at the surface 110 for distribution.

As previously noted, costs in a SAGD operation are dominated by the cost of heating the steam relative to the amount of bitumen extracted. Thus, there is a long-felt but unmet need to model the behavior of the SAGD well with the aim of optimizing the production of bitumen with the least amount of steam. The inventors are unaware of any systematic data-driven predictive modeling for these kinds of data.

Illustrative embodiments of the present invention seek to build data-driven predictive models for the production flow (e.g. oil or emulsion flow) relative to control-variables such as the amount of steam injected. Rather than only allowing the production flow to depend directly on the control-variables, illustrative embodiments of the present invention also seek to model the possibility of indirect effects of controls on production as intermediated through observable variables such as downhole temperatures.

Thus, an illustrative embodiment of the invention may comprise a method of modeling a SAGD oil well through multi-level (e.g., two-level) modeling. A first level may model the effects of control-variables (e.g. steam injected or pressure) on observable variables (e.g. downhole temperatures). A second level may model the effects of the controls and the observables on the output variable of interest (e.g. oil flow or emulsion rate). The models may produce executable functions that may be symbolically differentiable.

Additionally or alternatively, an illustrative embodiment of the invention may include a method of generating data driven predictive models of SAGD oil well performance by applying state of the art statistical models at two levels. First, observed variables may be predicted with respect to control-variables and any static variables. Second, an output variable of interest (such as emulsion rate or oil flow) may be modeled as function of both the control-variables and the predicted observed variables. The modeling may produce a machine executable function to reproduce and predict a desired output variable from a set of inputs.

Additionally or alternatively, an illustrative embodiment of the invention may include a method of modeling a SAGD oil well comprising selection of a first input data set, computation of a second input data set and applying a machine learning algorithm to said input data sets. Applying the machine learning algorithm to said input data sets may include training against a chosen output variable in order to generate an executable function capable of reproducing said chosen output variable from said input data sets. The executable function may be symbolically differentiable. The output variables may include at least one of emulsion flow and oil flow.

Figure 2:
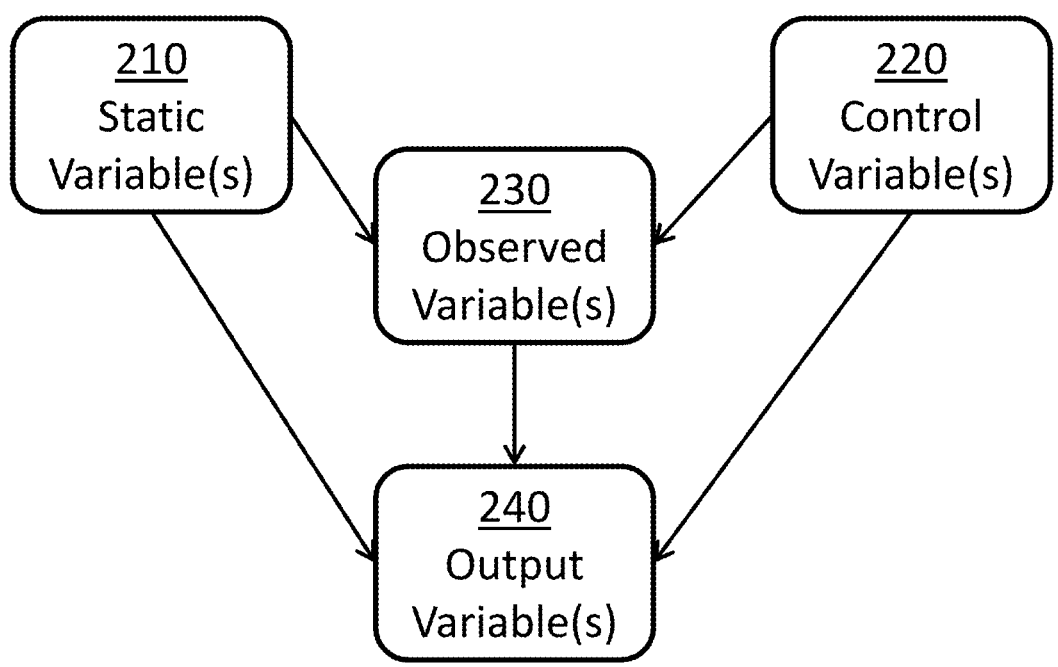
FIG. 2 shows an exemplary multi-level modeling framework according to an illustrative embodiment of the present invention.

FIG. 2 shows an exemplary two-level predictive modeling framework 200 according to an illustrative embodiment of the present invention. Although FIG. 2 shows a two-level predictive modeling framework, one skilled in the art would understand that principles of the present invention may be applied to other multi-level predictive modeling frameworks. Static variables 210 may include, for example, well position and/or depth, which may be measured in, e.g., meters or kilometers. Additionally or alternatively, static variables 210 may include one or more geological contexts, which may be for example associated with different parts of a given well. Control variables 220 may include, e.g., steam injection (e.g., toe steam flow and/or heel steam flow), gas casing pressure, and/or emulsion pressure.

In Level 1 of the two-level predictive modeling framework 200, one or more observable well variables 230 (e.g., downhole temperature, temperatures along producer and/or injector pipes, steam injection surface pressure, and/or blanket gas pressure) are modeled with respect to one or more control variables 220 and one or more static variables 210. Additionally or alternatively, observable variables 230 may include bottom hole pressure, producer temperature profile, sub-cool profile, heel surface pressure, and/or toe surface pressure.

In Level 2 of the two-level predictive modeling framework 200, one or more output variables 240 of primary interest are modeled with respect to the one or more observable variables 230 as well as the one or more control variables 220 and, optionally, one or more of the static variables 210. Output variables 240 may include, for example, oil flow and/or emulsion rate.

Before going into the specifics of the functional linear model below, a more general description of the two-level modeling may be helpful. The two-level modeling is important because when the control variables are changed the resulting observables are unknown (e.g. it is unknown how temperature will be affected after a given amount steam is injected). Therefore, the observables are modeled as functions of controls (Level 1) and then the predicted observables are used as input into Model 2 (at Level 2). This is an important observation because Emulsion cannot be predicted based on observables that have not yet been observed, and hence these observables need to be predicted first. Thus, in general an illustrative embodiment seeks to find two functions $f_1$ and $f_2$ that represent the two models at levels 1 and 2 respectively. The first function $f_1$ at level 1 maps the control and static variables onto the observables, i.e.

$$\text{Observables} = f_1(\text{ctrlvar}_1, \ldots, \text{ctrlvar}_K, \text{staticvar}_1, \ldots, \text{staticvar}_M),$$

Where "Observables" denotes a vector of one or more observables (e.g. bottom hole pressure, blanket gas pressure, producer temperature) and $ctrlvar_1, \ldots, ctrlvar_K$ denotes at least one or more (up to K) different control variables (e.g. toe steam flow, heel steam flow, gas casing pressure, and emulsion pressure) and $staticvar_1, \ldots, staticvar_M$ denotes at least one or more (up to M) different static variables (e.g. well position and/or depth). The function $f_1$ may be a physics-inspired deterministic function provided by a domain expert that exploits known relationships between physical variables in the literature. The function $f_1$ may also be a learned function from a Machine Learning algorithm e.g. Neural Network, Deep Learning, Random Forests, Functional Linear Model, and/or Regression. The second function $f_2$ maps the control, static and predicted observable variables (from level 1) onto the output variables, i.e.

Output=$f_2$($ctrlvar_1, \ldots, ctrlvar_K, staticvar_1, \ldots, staticvar_M, obsvar_1, \ldots, obsvar_N$), Where "Output" denotes a vector of one or more output variables (e.g. oil flow and/or emulsion rate) and $ctrlvar_1, \ldots, ctrlvar_K$ denotes at least one or more (up to K) different control variables (e.g. toe steam flow, heel steam flow, gas casing pressure, and emulsion pressure) and $staticvar_1, \ldots, staticvar_M$ denotes at least one or more (up to M) different static variables (among e.g. well position and/or depth) and $obsvar_1, \ldots, obsvar_N$ denotes at least one or more (up to N) different predicted observable variables from level 1 (e.g. downhole temperature, temperatures along producer and/or injector pipes, steam injection surface pressure, and/or blanket gas pressure). The function $f_2$ may be a physics-inspired deterministic function provided by a domain expert that exploits known relationships between physical variables in the literature. The function $f_2$ may also be a learned function from a Machine Learning algorithm e.g. Neural Network, Deep Learning, Random Forests, Functional Linear Model, and/or Regression.

Figure 3:
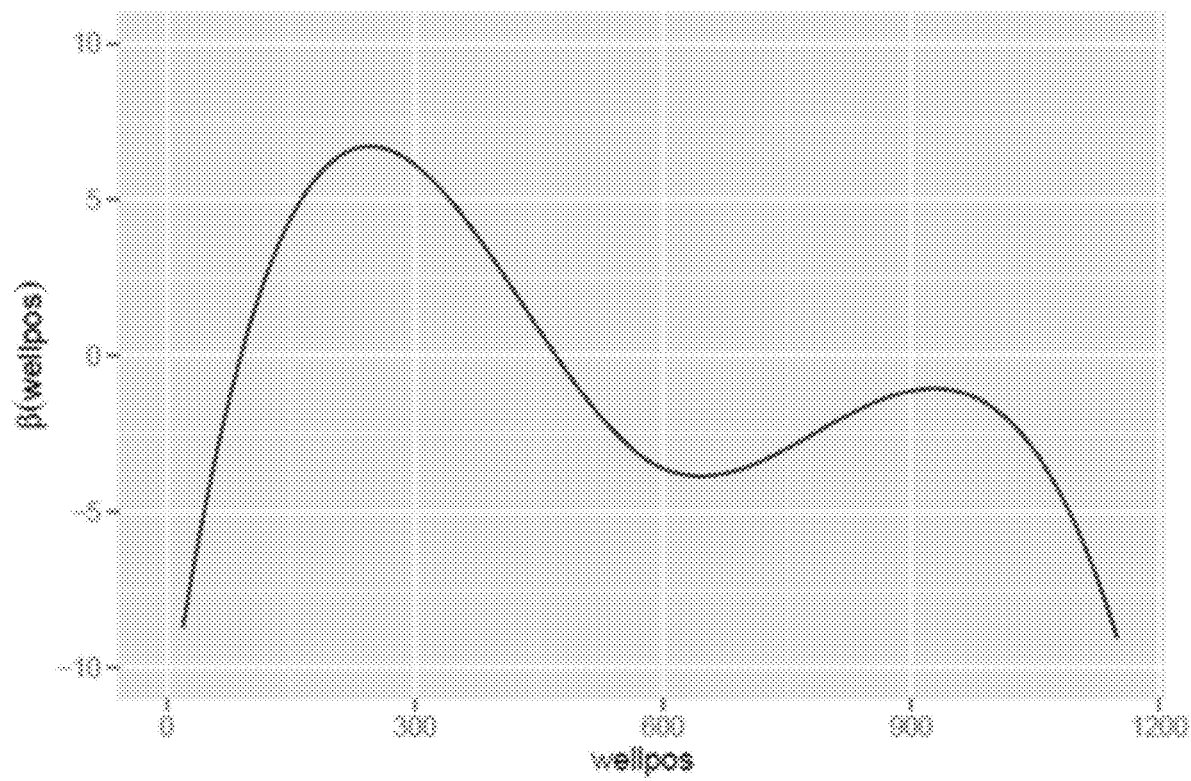
FIG. 3 shows the effect of downhole temperature on emulsion at different well positions.

As an example, looking first at Level 2, in which the output variable is modeled through a function $f_2$, Emulsion (an output variable 240) at different days i=1, ..., n can be modeled as function of corresponding (predicted) daily average downhole temperature profile (an observable variable 230) {$Temp_i(w)$, w=wellpos $\in[0,X](m)$} where wellpos=0 corresponds to the heel of the well and X denotes the toe of the well (i.e. X denotes the full well distance from heel to toe). Note, that these are predicted downhole temperature profiles as obtained from Model (1). A potential model for Emulsion would be the following functional linear model which incorporates only the observable variable, downhole temperature:

$Emulsion_i = \int \beta(w) Temp_i(w) dw + \varepsilon_i$  Model (2):

where the integral is over the well portion between heel and toe (i.e. [0,X](m)) and $\varepsilon_i$ denotes a random error associated with the prediction of average Emulsion at day i. Note that this is a generalization of the classical multiple linear regression model where a typical linear sum component $\Sigma_w \beta_w Temp_w$ is replaced by the integral $\int \beta(w) Temp_i(w) dw$. The function $\beta(w)$ is mathematically interpreted as the instantaneous per unit increase effect of downhole temperature Temp(w), at well position w, on average Emulsion. FIG. 3 shows an example of a graph that displays the instantaneous effect $\beta(w)$ of downhole temperature Temp(w) on Emulsion at different well positions w. As shown in FIG. 3, if Temp(w) is for example increased by 1° C. at well position w=150, the (instantaneous) increase in expected Emulsion is approximately $\beta(w)$=5 units as read by the function on the graph.

If Temp is increased by 1° C. uniformly across the whole well, the increase (or decrease depending on sign) of expected Emulsion will be $\int \beta(w) dw$. These effects can be written informally using derivative notation as $$\frac{\partial Emulsion}{\partial Temp}(w) = \beta(w) \text{ and } \frac{\partial Emulsion}{\partial Temp} = \int \beta(w) dw.$$

Note that any further or all observables 230, any or all control-variables 220, and any or static variables may can be incorporated into Model (2) either as linear or non-linear effects. Further, the functional linear model may be replaced by any other Machine Learning Algorithm or physics inspired function.

As an example, looking first at Level 1, an Additive Model, for example, can be used to model downhole temperatures (an observable variable 230) at different days i=1, ..., n as a function of control variables (220) and static variables (210):

$Temp_i(w) = \varepsilon_i(w) + \alpha_0(w) + \alpha_1 Temp_{i-1}(w) + \alpha_{ep}(w) \cdot emulsionPressure_i + \alpha_{gas}(w) \cdot gascasingPressure_i + \alpha_{heel}(w) \cdot heelSteamInjected_i + \alpha_{toe}(w) \cdot toeSteamInjected_i$  Model (1):

This means that the control variables (emulsionPressure, gascasingPressure, heelSteamInjected, toeSteamInjected) are assumed to have a linear relationship with Temp(w), Importantly however, note that this linear relationship is different depending on the well location w (static variable). So theoretically there can be for example a positive linear relationship between heelSteamInjected and Temp(w) at heel 130 (i.e. at w close to 0="wellpos at heel") but negative at toe 135 (i.e. at w close to X="wellpos at toe"). These linear relationships are estimated through the data.

The functional effects (i.e. the $\alpha$'s) in Model (2), visualized in FIGS. 4-7, are mathematically interpreted as per unit increase effect of control-variables on temperature. For example, $\alpha_{ep}(w)$ is interpreted as the expected increase/decrease in Temp(w) at well position w if emulsionPressure is increased by one unit, while all other parameters are held constant. This may be expressed mathematically as:

$$\frac{\partial Temp(w)}{\partial emulsionPress} = \alpha_{ep}(w)$$

$$\frac{\partial Temp(w)}{\partial gascasingPress} = \alpha_{gas}(w)$$

$$\frac{\partial Temp(w)}{\partial toeSteamInjected} = \alpha_{toe}(w)$$

$$\frac{\partial Temp(w)}{\partial heelSteamInjected} = \alpha_{heel}(w)$$

Figure 4:
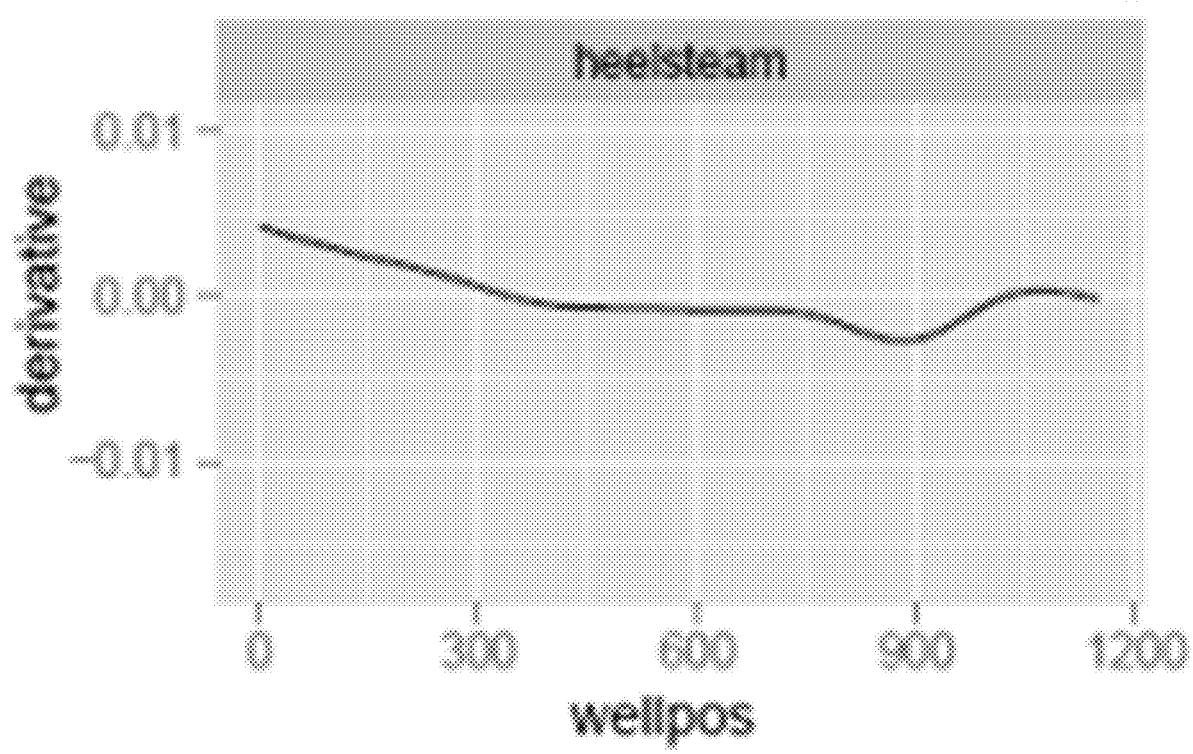
FIG. 4 shows the effect of amount of injected heel steam on downhole temperatures at different well positions.
Figure 5:
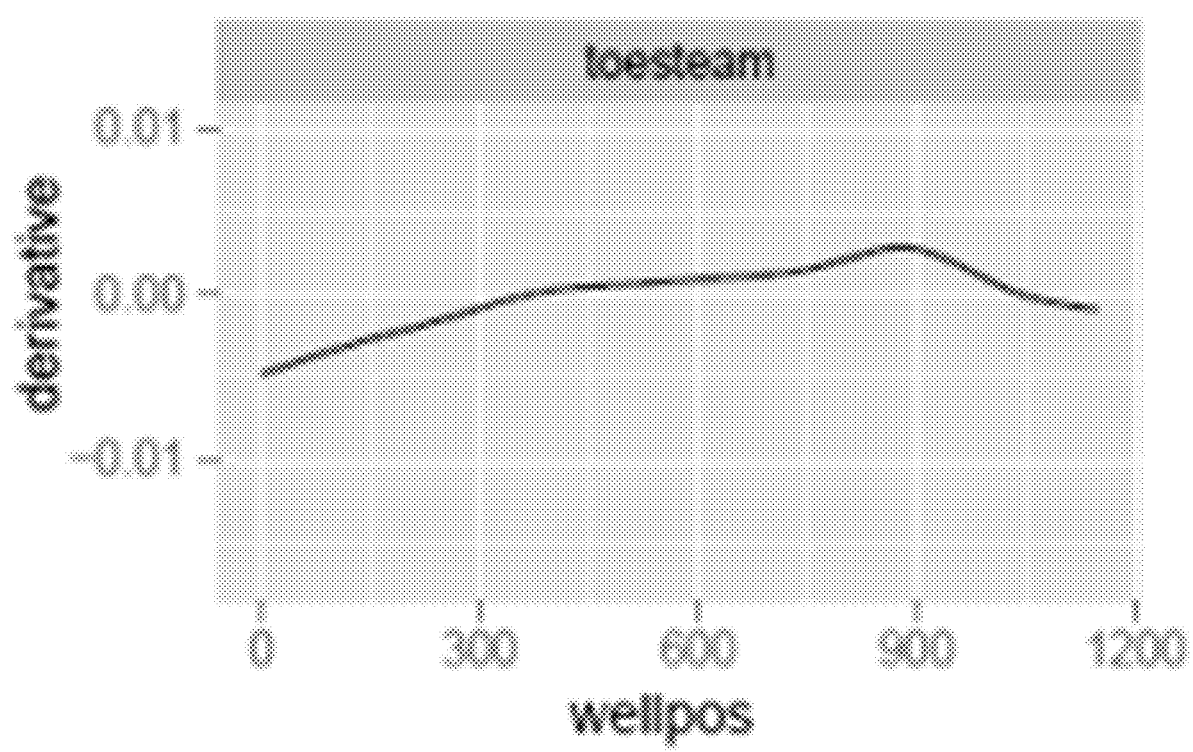
FIG. 5 shows the effect of amount of injected toe steam on downhole temperatures at different well positions.
Figure 6:
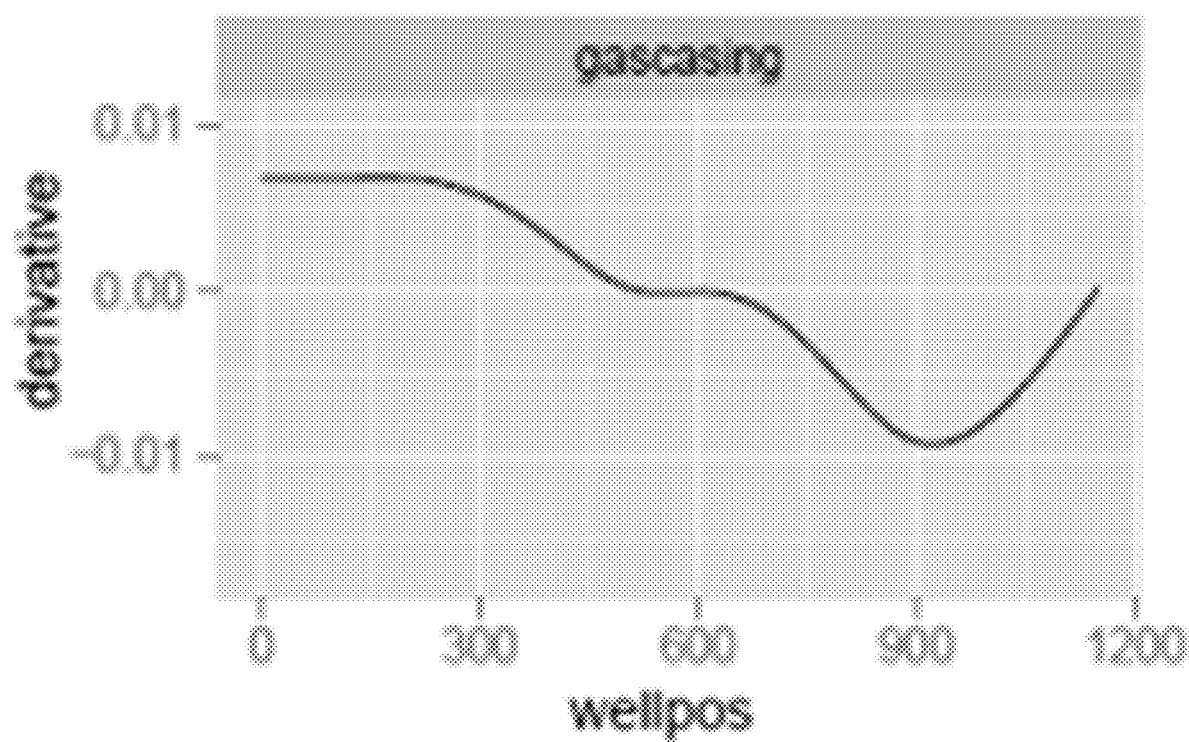
FIG. 6 shows the effect of gas casing pressure on downhole temperatures at different well positions.
Figure 7:
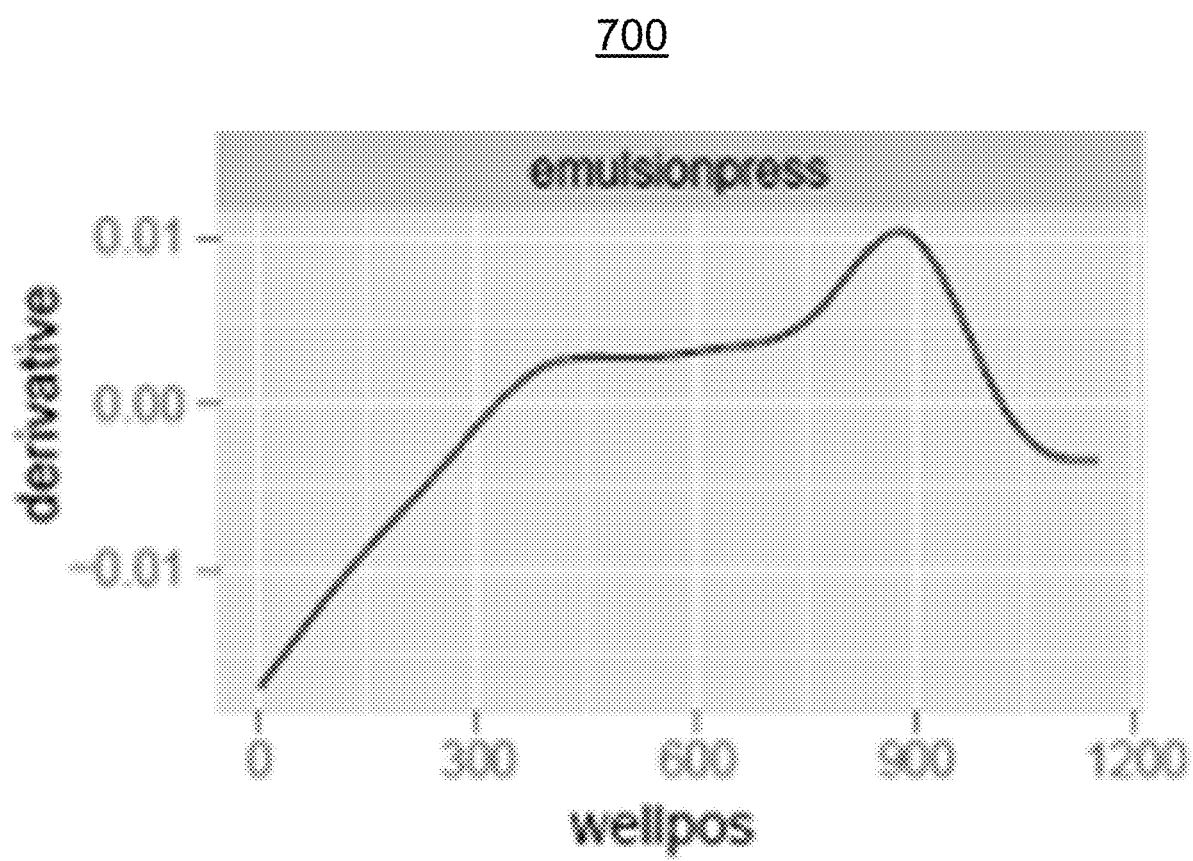
FIG. 7 shows the effect of emulsion pressure on downhole temperatures at different well positions.

FIGS. 4-7 show the effect of various control variables on downhole temperature (an observable variable 230) from Model (2) at different well positions. FIG. 4 shows the effect of amount of injected heel steam on downhole temperature at different well positions. FIG. 5 shows the effect of amount of injected toe steam on downhole temperature at different well positions. FIG. 6 shows the effect of gas casing pressure on downhole temperature at different well positions. FIG. 7 shows the effect of emulsion pressure on downhole temperature at different well positions.

FIG. 4 shows that the amount of heel steam injected has a positive effect on temperature at heel 130 (i.e. wellpos close to 0 m) but closer to the toe (e.g. at around and after wellpos=900 m) this effect is at or below 0. FIG. 5 shows an opposite effect with respect to the amount of toe steam injected: the amount of toe steam injected has a negative effect on temperature at heel 130 (i.e. wellpos close to 0 m) but closer to the toe (e.g. at around and after wellpos=900 m) this effect is at or above 0.

As shown in FIG. 6, increasing gas casing pressure leads to an increase in downhole temperature (temp) at well positions between around 0 and 450 meters. However, from 600 m onwards the effect is negative with a (negative) "peak" at around 900 meters. As shown in FIG. 7, increasing emulsion pressure leads to a decrease in downhole temperature (temp) at well positions between 0 and 300 meters. However, this effect becomes positive from 300 meters onwards, with a positive peak at around 900 meters.

Turning now to Level 2, in which the output variable is modeled through a function $f_2$, Emulsion (an output variable 240) at different days i=1, . . . , n can be modeled as function of corresponding (predicted) daily average downhole temperature profile (an observable variable 230) {Temp$_i$(w), w=wellpos $\in$[0,X] (m)} where wellpos=0 corresponds to the heel of the well and X denotes the toe of the well (i.e. X denotes the full well distance from heel to toe). Note, that these are predicted downhole temperature profiles as obtained from Model (1). A potential model for Emulsion would be the following functional linear model which incorporates only the observable variable, downhole temperature:

$$\text{Emulsion}_i = \int \beta(w) \text{Temp}_i(w) dw + \varepsilon_i \qquad \text{Model (2):}$$

where the integral is over the well portion between heel and toe (i.e. [0,X](m)) and $\varepsilon_i$ denotes a random error associated with the prediction of average Emulsion at day i. Note that this is a generalization of the classical multiple linear regression model where a typical linear sum component $\Sigma_w \beta_w \text{Temp}_w$ is replaced by the integral $\int \beta(w) \text{Temp}_i(w) dw$. The function $\beta(w)$ is mathematically interpreted as the instantaneous per unit increase effect of downhole temperature Temp(w), at well position w, on average daily Emulsion. FIG. 3 shows an example of a graph that displays the instantaneous effect $\beta(w)$ of downhole temperature Temp(w) on expected daily Emulsion at different well positions w. As shown in FIG. 3, if Temp(w) is for example increased by 1° C. at well position w=150, the (instantaneous) increase in expected daily Emulsion is approximately $\beta(w)$=5 units as read by the function on the graph.

If Temp is increased by 1° C. uniformly across the whole well, the increase (or decrease depending on sign) of expected Emulsion will be $\int \beta(w) dw$. These effects can be written informally using derivative notation as $$\frac{\partial \text{Emulsion}}{\partial \text{Temp}}(w) = \beta(w) \text{ and } \frac{\partial \text{Emulsion}}{\partial \text{Temp}} = \int \beta(w) dw.$$

Note that any further or all observables 230, any or all control-variables 220, and any or static variables may can be incorporated into Model (2) either as linear or non-linear effects. Further, the functional linear model may be replaced by any other Machine Learning Algorithm or physics-inspired function.

Figure 8:
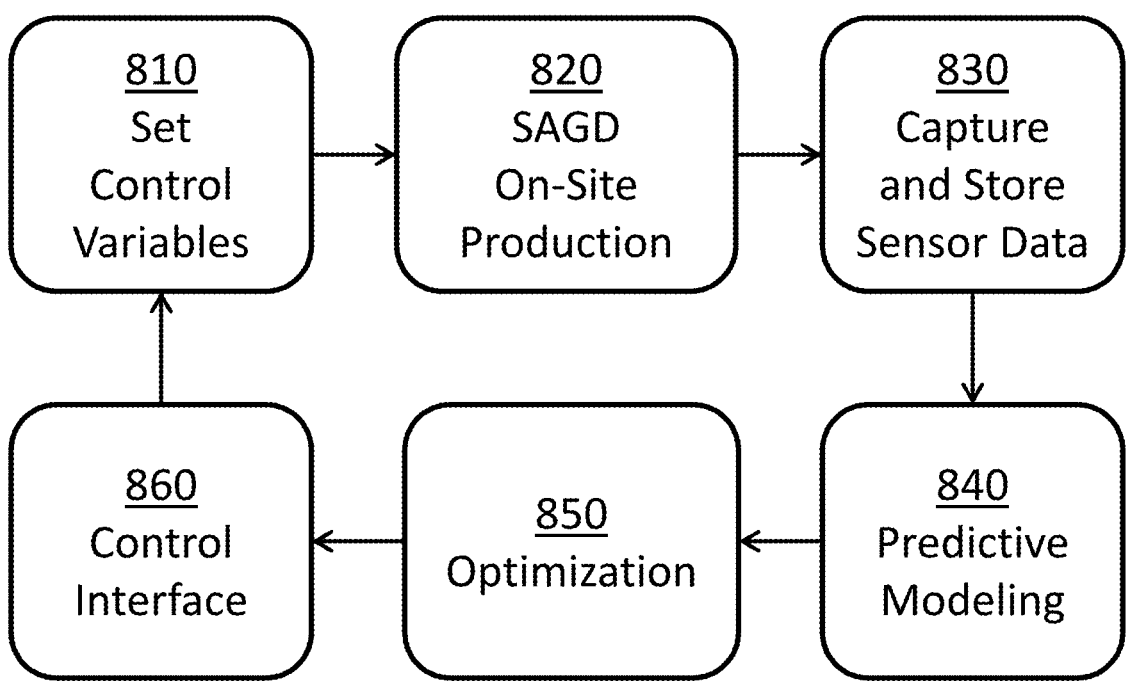
FIG. 8 shows a combined block and flow diagram for an exemplary system according to an illustrative embodiment of the present invention.

FIG. 8 shows a combined block and flow diagram for an exemplary system according to an illustrative embodiment of the present invention. One skilled in the art will understand that a system module may correspond to one or more method steps, and that a method step may correspond to one or more system modules. Thus, a given element shown in FIG. 8 may correspond to a method step or a system module.

In step 810, control variables for the SAGD well are set, as discussed above with reference to element 220 in FIG. 2. These control variables may include parameters associated with steam injection (e.g., by injector pipe 121 in FIG. 1), such as toe steam flow, heel steam flow, steam pressure, and/or steam injection temperature. Additionally or alternatively, these control variables may include gas casing pressure, emulsion pressure, and/or emulsion temperature. In an illustrative embodiment, the control variables for an injector pipe (e.g., 121 in FIG. 1) includes steam rate, while the control variables for a producer pipe (e.g., 122 in FIG. 1) includes pressure.

Step 820 involves on-site production by the SAGD well using the configuration of control variables which were set in step 810. Production continues until another action is taken, such as repeating step 810 to change one or more control variables. As previously discussed, SAGD well production involves a horizontal pipe injecting steam which circulates in an oil sands layer to make oil move towards a horizontal producer pipe.

In step 830, sensor data is captured and stored in a historical database in real time. In an illustrative embodiment, the sensor data for an injector pipe (e.g., 121 in FIG. 1) may include pressure, while the sensor data stream for a producer pipe (e.g., 122 in FIG. 1) may include temperature. The sensor data may include control variables (e.g., 220 in FIG. 2), observable variables (e.g., 230 in FIG. 2), and/or output variables (e.g., 240 in FIG. 2). The control variables may include parameters associated with steam injection (e.g., by injector pipe 121 in FIG. 1), such as toe steam flow, heel steam flow, steam pressure, and/or steam injection temperature. Additionally or alternatively, these control variables may include gas casing pressure, emulsion pressure, and/or emulsion temperature.

The observable variables may include, for example, downhole temperature, temperatures along producer and/or injector pipes, stream injection surface pressure, and/or blanket gas pressure. Additionally and/or alternatively, the observable variables may include, for example, bottom hole pressure, producer temperature profile, sub-cool profile, heel surface pressure, and toe surface pressure. The output variables may include, for example, emulsion rate and/or oil flow.

Step 840 involves predictive modeling at two levels using historical data for training. Since the observables are only observed after the control variables have been set, it is important to first model the observables at level 1 as function of controls and static variables. Then an analytical well model is provided at level 2 for output variables (oil flow and/or emulsion rate) with the aforementioned control variables (e.g., parameters associated with steam injection), predicted observables (from level 1) and static variables as input. The analytical well model at level 2 produces predicted output variables, e.g., predicted oil flow and/or emulsion rate. Historical data is then used to assess accuracy of the predictions, e.g. comparing observed data to predicted (e.g., of observable and output variables) and, if necessary, to make corrections to the analytical well model to improve the accuracy of future predictions.

Step 850 involves optimization which uses a predictive model (e.g., the analytical well model from step 840) to find an optimal configuration. The optimal configuration may be a set of control variables which maximizes one or more output variables (e.g., oil flow and/or emulsion rate) while satisfying constraints on one or more observable variables (e.g., maximum and/or minimum limits for temperatures and/or pressures). Thus, finding the optimal configuration may involve iteratively proposing changes to control variables (e.g., decreasing steam flow, increasing gas casing pressure, and maintaining the same emulsion pressure); inputting the changed control variables into the analytical well model to predict observable and output variables; ensuring that the predicted observable variables honor constraints; and comparing the predicted output variables to output variables for other configurations. In some embodiments, this comparison only considers configurations in which the constraints on observable variables are satisfied.

Step 860 involves a control interface, which may be a graphical user interface (GUI). Step 860 includes visualizing the model and considering the recommended optimal configuration. This may for example involve graphical visualization of graphs such as those depicted in FIGS. 3-7. This will assist the user to gain intuition about potential consequences of different decisions with regards to adjusting the control variables. Step 860 also includes evaluating model performance. This may be done for example by applying predictions on known and observed historical data to get a sense of how the system would have performed had it been applied in the past. This may for example give the user a sense of how high of a prediction error to expect when making adjustments of control variables. In some embodiments, the visualized model and recommended optimal configuration may be presented (e.g., displayed) to a user, who then performs the consideration of the optimal configuration and/or the evaluation of the model performance. The method then returns to step 810.

One or more embodiments of the invention, or elements thereof, can be implemented, at least in part, in the form of an apparatus including a memory and at least one processor that is coupled to the memory and operative to perform exemplary method steps.

Figure 9:
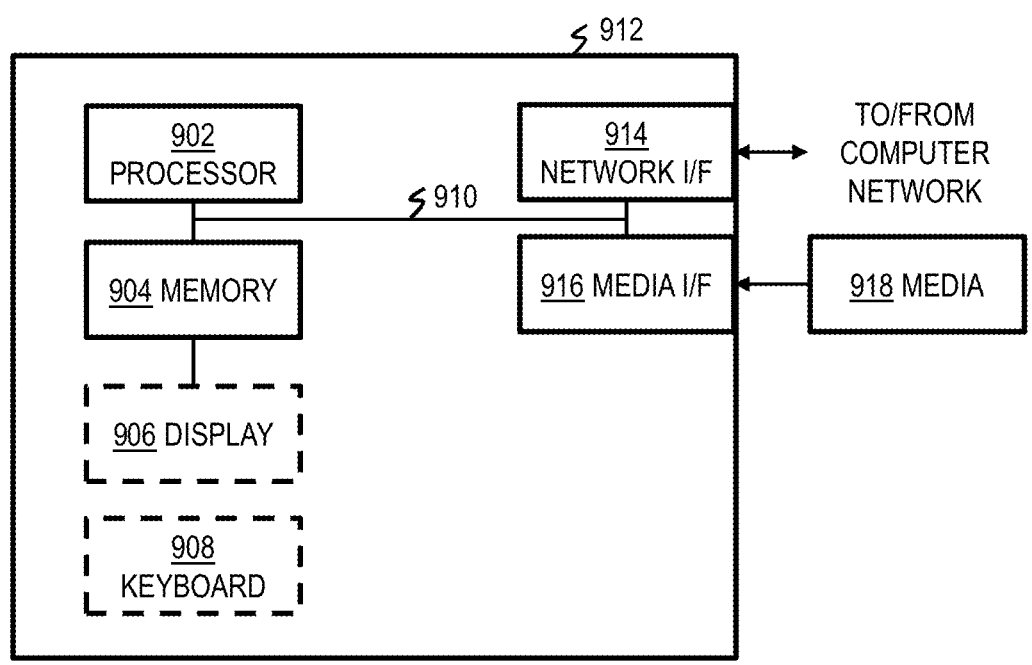
FIG. 9 depicts a computer system that may be useful in implementing one or more aspects and/or elements of the invention.

One or more embodiments can make use of software running on a general purpose computer or workstation. With reference to FIG. 9, such an implementation might employ, for example, a processor 902, a memory 904, and an input/output interface formed, for example, by a display 906 and a keyboard 908. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 902, memory 904, and input/output interface such as display 906 and keyboard 908 can be interconnected, for example, via bus 910 as part of a data processing unit 912. Suitable interconnections, for example via bus 910, can also be provided to a network interface 914, such as a network card, which can be provided to interface with a computer network, and to a media interface 916, such as a diskette or CD-ROM drive, which can be provided to interface with media 918.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 902 coupled directly or indirectly to memory elements 904 through a system bus 910. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 908, displays 906, pointing devices, and the like) can be coupled to the system either directly (such as via bus 910) or through intervening I/O controllers (omitted for clarity).

Network adapters such as network interface 914 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 912 as shown in FIG. 9) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the elements depicted in the block diagrams or other figures and/or described herein. The method steps can then be carried out using the distinct software modules and/or sub-modules of the system, as described above, executing on one or more hardware processors 902. Further, a computer program product can include a computer-readable storage medium with code adapted to be implemented to carry out one or more method steps described herein, including the provision of the system with the distinct software modules.

Exemplary System and Article of Manufacture Details

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for use with a steam assisted gravity drainage well, the method comprising:
   computing an analytical framework for the well at least in part by:
      modeling one or more observable variables as a function at least of one or more control variables; and
      modeling one or more output variables as a function at least of:
         at least one of the one or more control variables; and
         at least one of the one or more observable variables;
   utilizing the analytical framework to determine an optimal configuration for the well, the optimal configuration comprising a set of one or more values for the one or more control variables which produce one or more desired values for the one or more output variables; and
   configuring the well to operate with the determined optimal configuration, wherein the modeling the one or more observable variables comprises using additive modeling and the modeling the one or more output variables comprises using functional linear modeling.

2. The method of claim 1, wherein modeling one or more observable variables as a function at least of one or more control variables comprises modeling one or more observable variables as a function at least of:
   the one or more control variables; and
   one or more static variables.

3. The method of claim 2, wherein modeling one or more output variables comprises modeling one or more output variables as a function at least of:
   at least one of the one or more control variables;
   at least one of the one or more observable variables; and
   at least one of the one or more static variables.

4. The method of claim 1, further comprising predictive modeling using historical data for training of the analytical framework.

5. The method of claim 1, wherein the one or more desired values for the output variables are one or more maximum or minimum values with the observable variables satisfying one or more constraints.

6. The method of claim 1, wherein:
   the steam assisted gravity drainage well comprises an injector and a producer;
   a first one of the control variables comprises a steam rate of the injector;
   a second one of the control variables comprises a pressure of the producer;
   a first one of the observable variables comprises a pressure of the injector; and
   a second one of the observable variables comprises a temperature of the producer.

7. The method of claim 1, wherein utilizing the analytical framework to determine an optimal configuration for the well comprises:
   proposing changes to the one or more values for the one or more control variables;
   inputting the changed one or more values for the one or more control variables into the analytical framework to predict one or more values for the one or more output variables; and
   comparing the predicted values for the one or more output variables to values for the one or more output variables associated with other values for the one or more control variables.

8. The method of claim 1, wherein:
   the one or more control variables comprise at least one of: toe steam flow, heel steam flow, gas casing pressure, and emulsion pressure;
   the one or more observable variables comprise at least one of: downhole temperature, temperature along one or more of a injector and a producer, steam injection surface pressure, and blanket gas pressure; and
   the one or more output variables comprise at least one of: emulsion rate and oil flow.

9. An apparatus comprising:
   a memory; and
   at least one processor, coupled to said memory, and operative to:
      compute an analytical framework for a steam assisted gravity drainage well at least in part by:
         modeling one or more observable variables as a function at least of one or more control variables; and
         modeling one or more output variables as a function at least of:
            at least one of the one or more control variables; and
            at least one of the one or more observable variables;
      utilize the analytical framework to determine an optimal configuration for the well, the optimal configuration comprising a set of one or more values for the one or more control variables which produce one or more desired values for the one or more output variables;
      configure the well to operate with the determined optimal configuration, wherein the modeling the one or more observable variables comprises using additive modeling and the modeling the one or more output variables comprises using functional linear modeling.

10. The apparatus of claim 9, wherein modeling one or more observable variables as a function of at least one or more control variables comprises modeling one or more observable variables as a function of:
    the one or more control variables; and
    one or more static variables.

11. The apparatus of claim 9, wherein modeling one or more output variables comprises modeling one or more output variables as a function at least of:
    at least one of the one or more control variables;
    at least one of the one or more observable variables; and
    at least one of the one or more static variables.

12. The apparatus of claim 9, wherein the at least one processor is further operative to perform predictive modeling using historical data for training of the analytical framework.

13. The apparatus of claim 9, wherein the one or more desired values for the output variables are one or more maximum or minimum values with the observable variables satisfying one or more constraints.

14. The apparatus of claim 9, wherein:
    the steam assisted gravity drainage well comprises an injector and a producer;
    a first one of the control variables comprises a steam rate of the injector;
    a second one of the control variables comprises a pressure of the producer;
    a first one of the observable variables comprises a pressure of the injector; and
    a second one of the observable variables comprises a temperature of the producer.

15. A non-transitory computer readable medium comprising computer executable instructions which when executed by a computer cause the computer to perform the method of:
generating an analytical framework for a steam assisted gravity drainage well at least in part by:
modeling one or more observable variables as a function at least of one or more control variables; and
modeling one or more output variables as a function at least of:
at least one of the one or more control variables; and
at least one of the one or more observable variables;
utilizing the analytical framework to determine an optimal configuration for the well, the optimal configuration comprising a set of one or more values for the one or more control variables which produce one or more desired values for the one or more output variables;
configuring the well to operate with the determined optimal configuration, wherein the modeling the one or more observable variables comprises using additive modeling and the modeling the one or more output variables comprises using functional linear modeling.

16. The non-transitory computer readable medium of claim 15, wherein modeling one or more observable variables as a function of at least one or more control variables comprises modeling one or more observable variables as a function of:
the one or more control variables; and
one or more static variables.

17. The non-transitory computer readable medium of claim 15, wherein the method further comprises predictive modeling using historical data for training of the analytical framework.

18. The non-transitory computer readable medium of claim 15, wherein the one or more desired values for the output variables are one or more maximum or minimum values with the observable variables satisfying one or more constraints.

* * * * *